United States Patent
Tansu et al.

(10) Patent No.: US 9,349,910 B2
(45) Date of Patent: *May 24, 2016

(54) STAGGERED COMPOSITION QUANTUM WELL METHOD AND DEVICE

(71) Applicant: LEHIGH UNIVERSITY, Bethlehem, PA (US)

(72) Inventors: Nelson Tansu, Bethlehem, PA (US); Ronald A. Arif, Bethlehem, PA (US); Yik Khoon Ee, Bethlehem, PA (US); Hongping Zhao, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/168,362

(22) Filed: Jan. 30, 2014

(65) Prior Publication Data
US 2014/0191189 A1  Jul. 10, 2014

Related U.S. Application Data

(63) Continuation of application No. 12/520,708, filed as application No. PCT/US2007/088778 on Dec. 24, 2007, now Pat. No. 8,659,005.

(60) Provisional application No. 60/871,822, filed on Dec. 24, 2006.

(51) Int. Cl.
*H01L 29/06* (2006.01)
*H01S 5/00* (2006.01)
(Continued)

(52) U.S. Cl.
CPC .............. *H01L 33/06* (2013.01); *B82Y 20/00* (2013.01); *H01L 33/32* (2013.01); *H01S 5/0014* (2013.01); *H01S 5/342* (2013.01); *H01S 5/3422* (2013.01); *H01S 5/34333* (2013.01)

(58) Field of Classification Search
CPC ....... H01L 33/06; H01L 33/32; H01S 5/0014; H01S 5/342; H01S 5/3422; H01S 5/34333; B82Y 20/00
USPC .................... 257/13, 14, 79, 94, 95, E33.008, 257/E33.054, E33.068, E29.022; 315/363; 372/45, 45.01, 45.012; 438/46, 47
See application file for complete search history.

(56) References Cited

U.S. PATENT DOCUMENTS

| | | |
|---|---|---|
| 4,986,635 A | 1/1991 | Spry |
| 5,204,284 A | 4/1993 | Kuo et al. |

(Continued)

OTHER PUBLICATIONS

International Search Report, dated Jun. 13, 2008, issued in International priority Application No. PCT/US2007/088778.

(Continued)

*Primary Examiner* — Dao H Nguyen
(74) *Attorney, Agent, or Firm* — Saul Ewing LLP

(57) ABSTRACT

A light emitting device comprising a staggered composition quantum well (QW) has a step-function-like profile in the QW, which provides higher radiative efficiency and optical gain by providing improved electron-hole wavefunction overlap. The staggered QW includes adjacent layers having distinctly different compositions. The staggered QW has adjacent layers $X_n$, wherein X is a quantum well component and in one quantum well layer n is a material composition selected for emission at a first target light regime, and in at least one other quantum well layer n is a distinctly different composition for emission at a different target light regime. X may be an In-content layer and the multiple $X_n$-containing layers provide a step function In-content profile.

20 Claims, 7 Drawing Sheets

(51) Int. Cl.
  *H01L 33/06* (2010.01)
  *B82Y 20/00* (2011.01)
  *H01L 33/32* (2010.01)
  *H01S 5/34* (2006.01)
  *H01S 5/343* (2006.01)

(56) References Cited

U.S. PATENT DOCUMENTS

| | | | |
|---|---|---|---|
| 5,216,261 | A | 6/1993 | Inata et al. |
| 6,184,542 | B1 | 2/2001 | Alphonse |
| 6,194,241 | B1 | 2/2001 | Tsutsui et al. |
| 6,309,459 | B1 | 10/2001 | Yuge |
| 6,621,842 | B1 | 9/2003 | Dapkus |
| 6,791,104 | B2 | 9/2004 | Tansu et al. |
| 6,845,116 | B2 | 1/2005 | Mawst et al. |
| 6,958,497 | B2 | 10/2005 | Emerson et al. |
| 6,977,952 | B2 * | 12/2005 | Yamaguchi et al. ............ 257/14 |
| 7,256,417 | B2 | 8/2007 | Mawst et al. |
| 7,457,338 | B2 | 11/2008 | Mawst et al. |
| 7,518,139 | B2 | 4/2009 | Tansu et al. |
| 7,718,992 | B2 * | 5/2010 | Won et al. .................. 257/14 |
| 8,030,641 | B2 * | 10/2011 | Tansu et al. .................. 257/14 |
| 8,076,667 | B2 | 12/2011 | Tansu et al. |
| 8,659,005 | B2 * | 2/2014 | Tansu et al. .................. 257/14 |
| 2003/0001168 | A1 | 1/2003 | Tsuda et al. |
| 2003/0020085 | A1 | 1/2003 | Bour et al. |
| 2005/0170167 | A1 | 8/2005 | Kim et al. |
| 2005/0211993 | A1 | 9/2005 | Sano et al. |
| 2005/0238075 | A1 | 10/2005 | Jikutani et al. |
| 2006/0017061 | A1 | 1/2006 | Sakamoto et al. |
| 2006/0086932 | A1 | 4/2006 | Kim et al. |
| 2008/0144685 | A1 | 6/2008 | Tansu et al. |
| 2010/0327783 | A1 | 12/2010 | Tansu et al. |

OTHER PUBLICATIONS

International Search Report dated Sep. 19, 2008, issued in International priority Application No. PCT/US2007/088783.

Ee et al., "Enhancement of Light extraction efficiency of InGaN quantum wells light emitting diodes using SiO2/polystyrene microlens arrays," Appl. Phys. Lett. 91, 221107 (2007).

Arif et al., "Polarization engineering via staggered InGaN auantum wells for radiative efficiency enhancement of light emitting diodes," Appl. Phys. lett. 91, 091110 (2007).

Arif et al., "Polarization engineering via staggered InGaN quantum wells for radiative efficiency enhancement of light emitting diodes," Appl. Phys. Lett., vol. 91, pp. 091110 (2007).

Ee et al., "Enhancement of light extraction efficiency of InGaN quantum wells light emitting diodes using SiO2/polystyrene microlens arrays," Appl. Phys. Lett., vol. 91, pp. 221107 (2007).

International Search Report from PCT/US2007/088778 by Tansu et al. (Jun. 13, 2008).

International Search Report from PCT/US2007/088783 by Tansu et al. (Sep. 19, 2008).

* cited by examiner

STAGGERED COMPOSITION QUANTUM WELL METHOD AND DEVICE

CROSS REFERENCE TO RELATED APPLICATIONS

This application is a continuation of U.S. application Ser. No. 12/520,708, filed Jun. 22, 2009, which is the U.S. national phase of international Application No. PCT/US07/88778, filed Dec. 24, 2007, which claims the benefit of U.S. Provisional Application No. 60/871,822, filed Dec. 24, 2006, all of which being fully incorporated herein by reference.

STATEMENT REGARDING FEDERALLY SPONSORED RESEARCH OR DEVELOPMENT

This invention was made with government support under Contracts Nos. W911NF-07-2-0064 and 07014121 respectively awarded by the Department of Defense Army Research Lab and by the National Science Foundation. The government has certain rights in the invention.

BACKGROUND

The invention relates to a light emitting device such as a light emitting diode (LED) and/or lasers with staggered quantum wells (QWs) as the active regions.

An LED is a semiconductor diode that emits incoherent narrow-spectrum light when electrically biased in the forward direction of a p-n junction. This effect is a form of electroluminescence.

An LED typically comprises a small area source, often with extra optics added to the chip that shape its radiation pattern. Color of emitted light depends on semiconductor material composition and can be infrared, visible, or near-ultraviolet. The LED can comprise a chip of semiconducting material impregnated or doped with impurities to create the p-n junction. Charge-carriers—electrons and holes—flow into the junction from electrodes with different voltages. When an electron meets a hole, it falls into a lower energy level and releases energy in the form of a photon (light) causing current flow from the p-side, or anode, to the n-side, or cathode. The wavelength of the light emitted, and hence its color, depends on the band gap energy of the materials forming the p-n junction.

An optoelectronic device is based on the quantum mechanical influences of light on semiconducting materials. An optoelectronic device can include a multilayer semiconductor structure comprising a GaN layer and an active region comprising at least one QW layer of InGaN and GaN. In a typical InGaN QW, performance (luminescence efficiency) can be adversely affected by 1) defect density (threading dislocation) and 2) the existence of an electrostatic field. A high threading dislocation density leads to low radiative efficiency. Spontaneous and piezoelectric polarization of the InGaN/GaN QW can induce a built-in electrostatic field that results in significant reduction of electron-hole wavefunction overlap $\Gamma_{e\_hh}$ that reduces QW radiative recombination rate and optical gain.

There is a need for an InGaN/GaN QW with reduced defect, density and electron-hole wavefunction overlap $\Gamma_{e\_hh}$, for achieving higher radiative efficiency and optical gain.

BRIEF DESCRIPTION OF THE INVENTION

The invention provides an InGaN/GaN QW with improved electron-hole wavefunction overlap $\Gamma_{e\_hh}$, for achieving higher radiative efficiency and optical gain. The invention can be described as a light emitting device comprising a staggered composition quantum well.

In an embodiment, the invention is a method for improving light efficiency of a light emitting device, comprising: providing a semiconductor substrate; and forming on the substrate a succession of layers to provide QW comprising a staggered composition quantum well adjacent a GaN barrier layer.

In another embodiment, the invention is an optoelectronic device comprising: a multilayer semiconductor structure comprising a GaN layer and an active region, the active region comprising a staggered composition quantum well.

In another embodiment, the invention is a method for generating optical emission from an optoelectronic device, comprising: providing a GaN layer and an active region, the active region comprising a staggered composition quantum well; and exciting the active region to produce optical emission.

DETAILED DESCRIPTION OF THE INVENTION

Figure 1:
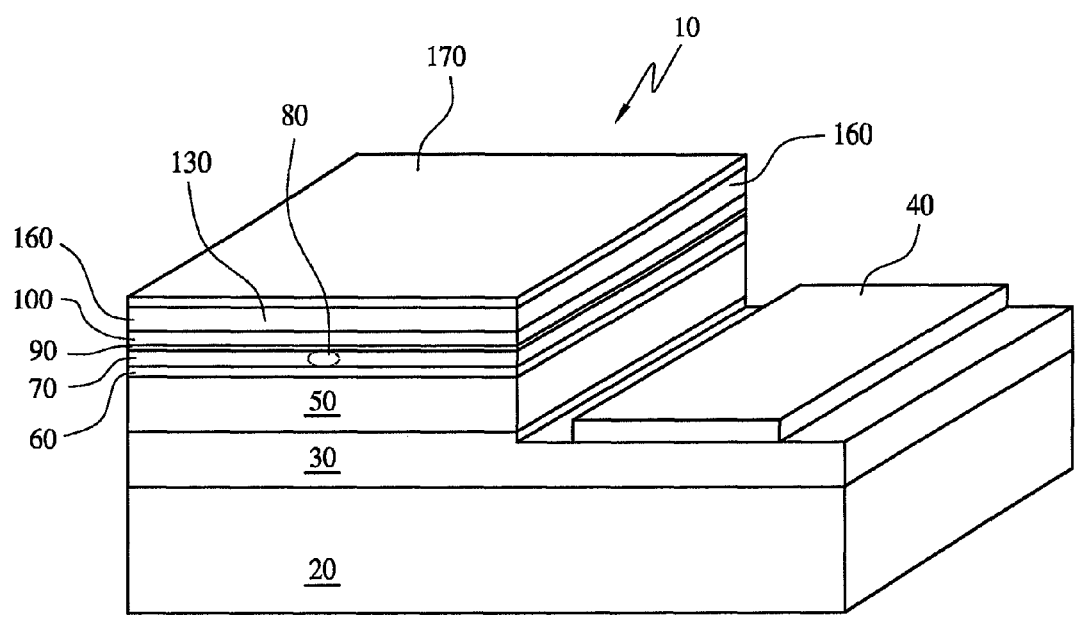
FIG. 1 is a schematic representation of GaN/InGaN QW.

LED light extraction efficiency is the portion of emitted electromagnetic radiation that is transmitted usable for human vision. It is a ratio of emitted luminous flux to radiant flux. The present invention relates to an LED with improved light extraction efficiency.

An LED can comprise a chip of semiconducting material impregnated or doped with impurities to create a p-n junction. Current flows from the p-side or anode, to the n-side or cathode, but not in the reverse direction. Charge carriers—electrons and holes—flow into the junction from electrodes with different voltages. When an electron meets a hole, it falls into a lower energy level and releases energy in the form of a photon.

A quantum well is an LED potential well. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes and at least a second semiconductor layer with a band gap greater than that of the first semiconductor layer. A "substrate" is an underlying template or substratum can such as a sapphire template, a GaN substrate, a Si substrate, SiC substrate or ZnO substrate.

A QW structure can be formed by sandwiching a semiconductor thin layer of a narrow band gap between semiconductor layers of a large band gap. If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers.

In an embodiment, the invention relates to an optoelectronic device that includes a GaN layer and a quantum well active region. The active region can comprise at least a staggered InGaN quantum well layer, with different In-composition in the quantum well active region, surrounded by GaN barriers. The electron quantum well layers and hole quantum well layer form a first quantum well stage. The active region can include a plurality of the quantum well stages adjacent to each other having the same structure as the first quantum well stage. The structure can include a transitional layer of GaN between each quantum well stage.

A III-Nitride gain media emitting in the visible regime can be based on a type-I InGaN QW. Challenges to high performance in these InGaN QWs include 1) defect density (threading dislocation) including phase separation in high-In content InGaN QW, and 2) the existence of electrostatic fields in III-Nitride semiconductor. High threading dislocation density leads to low radiative efficiency. Spontaneous and piezoelectric polarizations induce built-in electrostatic fields resulting in significant reduction of electron-hole wavefunction overlap $\Gamma_{e\_hh}$. The radiative recombination rate and optical gain of the InGaN QW may be further reduced due to the small $\Gamma_{e\_hh}$.

The present invention provides a method and structure to improve luminescence efficiency in nitride gain media by utilizing a staggered InGaN QW with a step-function In-content profile. According to Fermi's rule, electronic transition from |2> to |1> is governed by a transition matrix element via the interacting Hamiltonian value $\hat{H}'_{21}$, resulting in quantum mechanical transition rate $$W_{2\rightarrow 1} = \frac{2\pi}{\hbar} \cdot |\hat{H}'_{21}|^2 \rho_f (E_1 = E_2 - \eta\omega_0),$$

where $\rho_f$ is the density of the final state. The Hamiltonian $\hat{H}'_{21}$ in a semiconductor can be expressed in terms of transition matrix element and envelope functions overlap acceding to $|H'_{21}|^2 \sim \langle u_c|\hat{e}\cdot\vec{p}|u_v\rangle^2 \cdot |\Gamma_{e\_hh}|^2$. The $|u_c\rangle$ and $|u_v\rangle$ refer to the conduction and valence band Bloch functions, respectively. Radiative recombination rate and optical gain are thus proportional to the square of the envelope electron and hole wavefunction overlap $|\Gamma_{e\_hh}|^2$.

The improved efficiency invention may be embodied in various types of optoelectronic devices including amplifiers, light emitting diodes, and edge emitting and surface emitting lasers that incorporate optical feedback to provide lasing action. The invention may find application in solid state lighting, solid state displays, lasers, light emitting diodes (LEDs), biomedical therapy and diagnostic devices, medical lasers, eye surgery devices and DVD lasers.

These and other features of the invention will become apparent from the drawings and following detailed discussion, which by way of example without limitation describe preferred embodiments of the invention.

FIG. 1 is a front elevation view showing a nitride-based laser device structure 10 according to an embodiment of the present invention. Laser device structure 10 is formed on substrate 20. Substrate 20 can be sapphire, $Al_2O_3$, SiC, AlN, or GaN for example. Device 10 includes an n-type contact layer 30, for example GaN:Si or AlGaN:Si formed on substrate 20. An n-electrode 40, for example Ti/Au, Ti/Al, Ti/Al/Au or Ti/Al/Mo/Au, is formed on a first region of n-type contact layer 30 and an n-type lower cladding layer 50, for example AlGaN:Si is formed on a second region of n-type contact layer 30. An n-type lower waveguide layer 60 for example GaN:Si, InGaN:Si, or AlGaN:Si is formed on lower cladding layer 50.

The device 10 includes a QW 70 that comprises staggered GaN/InGaN layers. In this context "staggered" means a composition $X_n$ wherein X is a quantum well component and in one quantum well layer, n is a greater step function than a layer comprising a composition for emission at a target light regime and in at least one other quantum well layer, n is a lesser step function than in the layer comprising a composition for emission at a target light regime. The value for n in one layer and in the other, provide alternating values of the center value providing a target regime. In the illustrated QW region 70, an InGaN layer can comprise multiple InGaN layers of varying In and Ga content. For example, 13-Å $In_{0.28}Ga_{0.72}N/13$-Å $In_{0.21}Ga_{0.29}N$ are staggered compositions to a 27-Å $In_{0.26}Ga_{0.74}N$ QW. Another example includes layers arranged in multiple periods, for example 4-periods of 7.5-Å $In_{0.25}Ga_{0.75}N/7.5$-Å $In_{0.15}Ga_{0.85}N$. In these examples, X is an In-content and the multiple $X_n$-containing layers provide a step function In-content profile.

In FIG. 1, the staggered InGaN quantum well layers are sandwiched between corresponding GaN barrier layers formed on lower waveguide layer 60. An optional p-type confinement layer 90 such as AlGaN:Mg, is formed on QW region 70. A p-type upper waveguide layer 100 such as GaN:Mg, AlGaN:Mg or InGaN:Mg, is formed on confinement layer 90. An upper cladding layer 50 is formed on upper waveguide layer 100 and located over active region 80 of QW region 70. Isolation layer portions 160 are formed on opposite sides of upper cladding layer 130. Finally, a p-electrode 170 such as Ti/Au, Ti/Al, Ti/Al/Au, Ti/Al/Mo/Au, Ni/Au, or Ni/Al is formed on upper cladding layer 130 and isolation layer portions 160.

The QW structures can be grown by III-V semiconductor MOCVD/MBE epitaxy and molecular beam epitaxy (MBE). However, for manufacturing considerations such as high-throughput, the use of metal organic chemical vapor deposition (MOCVD) growth may be preferred.

The following EXAMPLES are illustrative and should not be construed as a limitation on the scope of the claims unless a limitation is specifically recited.

EXAMPLES

The EXAMPLES are based on the following theory and calculations:

Fermi's golden rule provides a calculation for transition rate (probability of transition per unit time) from one energy eigenstate of a quantum system into a continuum of energy eigenstates, due to a perturbation. According to Fermi's golden rule, electronic transition from state |2⟩ to |1⟩ is governed by transition matrix elements via the perturbation Hamiltonian $\hat{H}'_{21}$ to provide the quantum mechanical transition rate $W_{2\to1}$ as follows:

$$W_{2\to1} = \frac{2\pi}{\hbar} \cdot |H'_{21}|^2 \rho_f(E_1 = E_2 - \eta\omega_0)$$

where $\rho_f$ is the density of final states and $\hat{H}'_{21}$ is expressed as a function of the transition matrix element and the envelope functions overlap. In a semiconductor, transitions occur between conduction band states and valence band states that result in the following perturbation Hamiltonian $|\hat{H}'_{21}|^2 \propto \cdot |\langle u_c|\hat{e}\cdot p^w|u_v\rangle|^2 \cdot |\langle F_2|F_1\rangle|^2$, which depends on the square of transition matrix element $|M_T|^2=|\langle u_c|\hat{e}\cdot p^w|u_v\rangle|^2$ and the square of envelope electron-hole wave function overlap $\Gamma_{e\_hh}$. Conduction and valence band Bloch functions are referred to as $|u_c\rangle$ and $|u_v\rangle$, respectively, while $|F_2\rangle$ and $|F_1\rangle$ are envelope electron and hole wavefunctions, respectively. Strength of the electric field and electron interaction is indicated by the dot product of electric field polarization ê and the electron momentum $p^w$. For the case of spontaneous combination, since emission is not initiated by the presence of existing photons but rather energy fluctuations in the vacuum state, the transition matrix element term reduces to $|\langle u_c|u_v\rangle|^2$ for a case of spontaneous combination. Both spontaneous radiative recombination rate ($W_{Spontaneous}$) and stimulated emission rate ($W_{Stimulated}$) are then proportional to the square of the envelope electron and hole wavefunction overlap $|\Gamma_{e\_hh}|^2$, as follows: $W_{Spontaneous} \sim |\langle u_c|u_v\rangle|^2 \cdot |\Gamma_{e\_hh}|^2$, $W_{Stimulated} \sim |\langle u_c|\hat{e}\cdot p^w|u_v\rangle|^2 \cdot |\Gamma_{e\_hh}|^2$.

Therefore, radiative recombination rate and optical gain of III-Nitride active regions can be enhanced by engineering nanostructures with improved overlap.

A numerical model was developed to design a conventional (non-staggered) InGaN QW and an inventive staggered InGaN QW. The model was based on 6×6 k·p formalism for wurtzite semiconductor. Luminescence characteristics were studied by calculating spontaneous recombination rate spectra using energy dispersion relation and momentum matrix elements for both the conventional and staggered InGaN QW. Valence band states mixing, strain, and spontaneous and piezoelectric polarization-induced electric fields were taken into account in the calculations. Band parameters for III-Nitride alloys were obtained from references (S L Chuang and C S Chang, "A band-structure model of strained quantum-well wurtzite semiconductors", *Semicond. Sci. Technol.*, vol. 12, pp. 252-263, March 1997; S L Chuang, "Optical gain of strained wurtzite GaN quantum-well lasers", *IEEE J. Quant. Elect.*, vol. 32, pp. 1791-1800, October 1996; I. Vurgaftman and J. R. Meyer, "Band parameters for nitrogen-containing semiconductors," *J. Appl. Phys.*, vol. 94, pp. 3675-3696, September 2003; J. Piprek, *Semiconductor Optoelectronic Devices: Introduction to Physics and Simulation*, London: Academic Press, 2003; Y. C. Yeo, T. C. Chong, M. F. Li, and W. J. Fan., "Analysis of optical gain and threshold current density of wurtzite InGaN/GaN/AlGaN quantum well lasers," *J. Appl. Phys.* vol. 84, pp. 1813-1819, August 1998; J. Wu, W. Walukiewicz, W. Shan, K. M. Yu, J. W. Ager III, S. X. Li, E. E. Haller, H. Lu, and W. J. Schaff, "Temperature dependence of the fundamental band gap of InN", *J. Appl. Phys.*, vol. 94, pp. 4457-4460, October 2003; O. Ambacher, J. Majewski, C. Miskys, A. Link, M. Hermann, M. Eickhoff, M. Stutzmann, F. Bernardini, V. Fiorentini, V. Tilak, W. J. Schaff and L. F. Eastman, "Pyroelectric properties of Al(In)GaN/GaN hetero- and quantum well structures", *J. Phys.: Condens. Matter*, vol. 14, pp. 3399-3434, March 2002). These parameters are listed in TABLE I.

TABLE I

| Parameter | GaN | InN |
|---|---|---|
| Lattice constants | | |
| a (Å) | 3.189 | 3.548 |
| Energy constants | | |
| $E_g$ (eV) | 3.42 | 0.6405 |
| $D_1 = D_{cr}$ (eV) | 0.019 | 0.041 |
| $D_{so}$ | 0.014 | 0.001 |
| $D_2 = D_3 = D_{so}/3$ (meV) | 4.67 | 0.33 |
| Bowing parameter (eV) | | 1.4 |
| Conduction band effective masses | | |
| $me_z/m_o$ | 0.18 | 0.11 |
| $me_t/m_o$ | 0.2 | 0.11 |
| Valence band effective mass parameters | | |
| $A_1$ | −7.24 | −9.24 |
| $A_2$ | −0.51 | −0.6 |
| $A_3$ | 6.73 | 8.68 |
| $A_4$ | −3.36 | −4.34 |
| $A_5$ | −3.4 | −1.47 |
| $A_6$ | −4.9 | −1.64 |
| Deformation potentials (eV) | | |
| $a_c$ | −4.08 | −4.08 |
| $D_1 = D_{cr}$ | 0.7 | 0.7 |
| $D_2$ | 2.1 | 2.1 |
| $D_3$ | 1.4 | 1.4 |
| $D_4$ | −0.7 | −0.7 |
| Elastic stiffness constants ($10^{11}$ dyn/cm$^2$) | | |
| $C_{13}$ | 10 | 12.4 |
| $C_{33}$ | 39.2 | 18.2 |

GaN electron effective mass constants of 0.18 $m_o$ and 0.2 $m_o$ were used for c-axis and transverse direction, respectively. InN electron effective mass values of 0.11 $m_o$ were used for both the c-axis and transverse directions. Heavy hole effective masses were calculated following the treatment presented in Piprek, et al., supra. The ratio of conduction and valence band offsets $\Delta E_c:\Delta E_v$ was taken as 70:30. Energy gap of the InGaN QW was calculated using a bowing parameter of 1.4 eV and an InN energy gap of 0.6405 eV. Indium concentration profile along the growth axis was incorporated into energy band lineup, with corresponding strain taken into account as band edge energy shifts. Polarization-induced electric field was manifested in the energy band bending. Spontaneous polarization $P_{sp\_InGaN}$ (C/m$^2$) and piezoelectric polarization $P_{pz\_InGaN}$ (C/m$^2$) in the InGaN QW were calculated using the following relations:

$$P_{sp\_InGaN}(x) = 0.042 \cdot x - 0.034(1-x) + 0.037 \cdot x \cdot (1-x),$$

$$P_{pz\_InGaN}(x) = 0.148 \cdot x - 0.0424 \cdot x \cdot (1-x),\text{ with } x \text{ as the QW In content.}$$

Spontaneous recombination rate per unit energy per unit volume $r_{sp}(\eta\omega)$ was calculated assuming that the momentum-matrix element of spontaneous emission is the angular average of two TE-polarization components in the transverse plane and one TM-polarization component in the z-direction.

$$r_{sp}(\eta\omega) = \frac{n^2\omega^2}{\pi^2 \cdot \eta \cdot c^2} \cdot \frac{(2 \cdot g_{sp}^{TE} + g_{sp}^{TM})}{3},$$

with $g_{sp}^{TE\ or\ TM}$ defined as $$g_{sp}^e(\eta\omega) = \frac{2\cdot q^2\cdot \pi}{n\cdot c\cdot \varepsilon_o\cdot m_o^2\cdot \omega\cdot L_w}\cdot$$

$$\sum_{\sigma=U,L}\sum_{n,m}\int\frac{k_t\cdot dk_t}{2\cdot \pi}\cdot |(M_e)_{nm}^\sigma(k_t)|^2\cdot \frac{f_n^c(k_t)\cdot(1-f_{\sigma m}^v(k_t))\cdot(\gamma/\pi)}{(E_n^c(k_t)-E_{\sigma,m}^v(k_t)-\eta\omega)^2+\gamma^2}.$$

Fermi Dirac distribution functions for electron $f_n^c$ and hole $f_{\sigma m}^v$ were defined as $$f_n^c(k_t) = \frac{1}{1+\exp\left(\frac{E_n^c(k_t)-F_c}{k_B\cdot T}\right)}$$

and $$f_{\sigma m}^v(k_t) = \frac{1}{1+\exp\left(\frac{E_{\sigma,m}^v(k_t)-F_v}{k_B\cdot T}\right)}$$

where $E_n^c$ and $E_{\sigma,m}^v(k_t)$ are the eigenenergies of electron and hole, respectively. Parameters $F_c$ and $F_v$ are carrier-density dependent quasi Fermi levels for electron and holes. These terms are related to injection carriers in the QW. Electron and hole concentrations in the QW were assumed to be equal. TE- and TM-polarized matrix elements are shown following:

$$|(M_e)_{nm}^\sigma(k_t)|^2 = \frac{|\langle S|p_x|X\rangle|^2}{4}\cdot\left\{\langle\phi_n\,|\,g_m^{(1)}\rangle^2+\langle\phi_n\,|\,g_m^{(2)}\rangle^2\right\}\text{ for }\sigma=U$$

$$= \frac{|\langle S|p_x|X\rangle|^2}{4}\cdot\left\{\langle\phi_n\,|\,g_m^{(4)}\rangle^2+\langle\phi_n\,|\,g_m^{(5)}\rangle^2\right\}\text{ for }\sigma=L$$

$$= \frac{|\langle S|p_z|Z\rangle|^2}{4}\cdot\langle\phi_n\,|\,g_m^{(6)}\rangle^2\text{ for }\sigma=L,$$

where $\phi_n$ and $g_m$ are respectively conduction and valence band confined states. These confined states are the eigenvectors of a block-diagonalized six-by-six Hamiltonian matrix. The Upper and lower Hamiltonian blocks were indicated by $\sigma=U$ and $\sigma=L$, respectively. Linewidth broadening with Lorentzian shape of $\gamma=0.1$ ps was used throughout the calculations. Details of the material parameters utilized in the calculation are listed in TABLE I. In these EXAMPLES, the conventional and staggered InGaN QWs were designed for emission in a particular wavelength regime with the staggered QWs optimized to give the largest wavefunction overlap ($\Gamma_{e\_hh}$ at the band edge k=0) in that regime.

As matters of definition, an energy band lineup calculation is a method to compute energy band edges of conduction bands and valence bands of different types of semiconductor materials. Energy band lineup is used to determine transition wavelength and electron-hole wavefunction overlap $\Gamma_{e-hh}$. The term "wurtzite band edge energies" refers to energy band edges of semiconductor materials that are in a hexagonal crystal configuration. Band structure parameters are experimentally-measured material parameters used as inputs to calculate the energy band lineup, e.g., energy gap, effective mass and affect of strain. In the drawings, $\Psi$ is wavefunction. In the FIG. 2, $\Psi_e$ is electron hole wavefunction and $\Psi_{hh}$ is heavy hole wavefunction.

The EXAMPLES are PL/CL studies of designed 420-430 nm emitting structures, PL/CL studies of 500-505 nm emitting structures and studies of LED 455-465 nm emitting structures. In the EXAMPLES, both conventional and staggered InGaN QWs were designed for emission at a particular wavelength regime. Conventional InGaN structures were based on QW layers with thicknesses (wc$_1$) of 25-27 Å and In-contents (xc$_1$) of 15% (for $\lambda_{peak}$=420-430 nm), 21% (for $\lambda_{peak}$=455-465 nm), 26% (for $\lambda_{peak}$=500-505 nm). Then, the staggered InGaN QW structures were optimized at each wavelength regime with improved wavefunction overlap ($\Gamma_{e\_hh}$), with a goal of achieving improved radiative recombination rate and radiative efficiency. Thus, thickness (ws$_1$, ws$_2$, total thickness=ws$_1$+ws$_2$) for the staggered InGaN QWs (with In-contents xs$_1$ and xs$_2$) were not designed specifically to be equal to that (wc$_1$) of the conventional InGaN QWs (with In content of xc$_1$). Rather the parameters used in the staggered structures (xs$_1$, ws$_1$, and xs$_2$, ws$_2$) were based on the numerical model calculations for optimized wavefunction ($\Gamma_{e\_hh}$) at each particular emission wavelength.

Figure 2A:
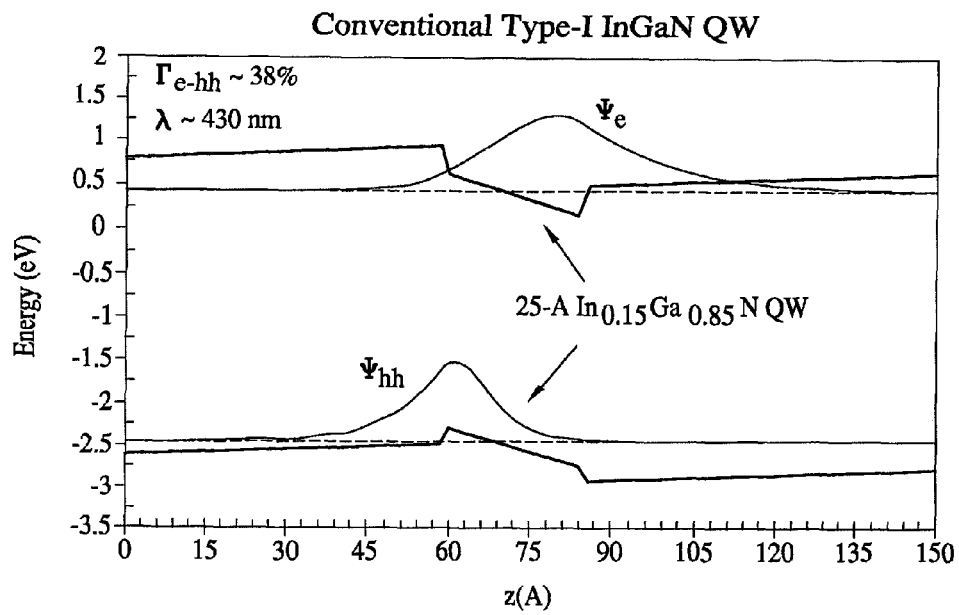
FIGS. 2A and 2B are graphs showing energy band lineup.
Figure 2B:
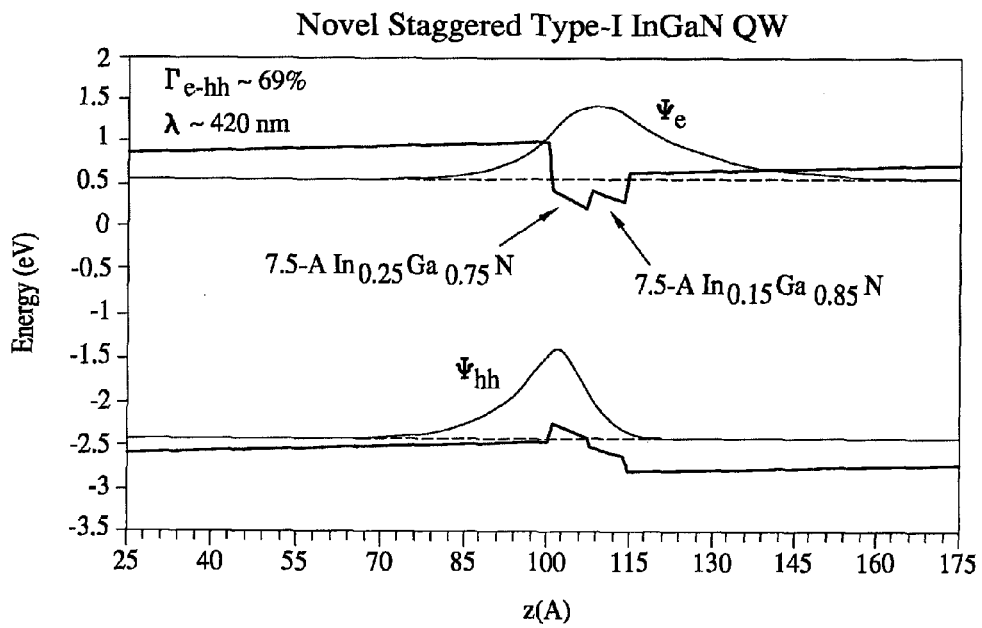

FIG. 2 shows band lineup of a 25-Å In$_{0.15}$Ga$_{0.85}$N QW surrounded by GaN barriers with corresponding electron and hole wave functions for emission at $\lambda$~430-nm regime. The polarization field in a conventional InGaN QW leads to low wavefunction overlap $\Gamma_{e\_hh}$ of only ~38%. A staggered QW consisted of 7.5-Å In$_{0.25}$Ga$_{0.75}$N and 7.5-Å In$_{0.15}$Ga$_{0.85}$N layers surrounded by GaN barriers. The staggered InGaN QW provided a "pulling" of electron wavefunctions from right to the center of the QW due to the lighter electron effective mass in comparison to the hole effective mass. The hole wave function was relatively unchanged due to the heavier hole effective mass. As a result, wavefunction overlap $\Gamma_{e\_hh}$ for the staggered InGaN QWs was increased by a factor of two times to almost ~69%. An improvement of the wavefunction overlap $\Gamma_{e\_hh}$ by a factor of ~2 translates to ~4-times improvement in radiative recombination rate and optical gain of the active region.

Experiments were conducted to compare optical properties of staggered InGaN QWs and conventional InGaN QW, with emission wavelength ~420-430 nm. Both conventional and staggered InGaN QWs samples were grown by metalorganic chemical vapor deposition (MOCVD) on 2.5-μm thick undoped GaN (T$_g$1080° C.) grown on c-plane sapphire, employing a low temperature 30-nm GaN buffer layer (T$_g$535° C.). The conventional QW structure consisted of 4-periods of 25-Å In$_{0.15}$Ga$_{0.85}$N QW, while the staggered QW structure was formed by 4-periods of 7.5-Å In$_{0.25}$Ga$_{0.75}$N/7.5-Å In$_{0.15}$Ga$_{0.85}$N layers. The QW structures included 11-nm GaN barrier layers.

Figure 3:
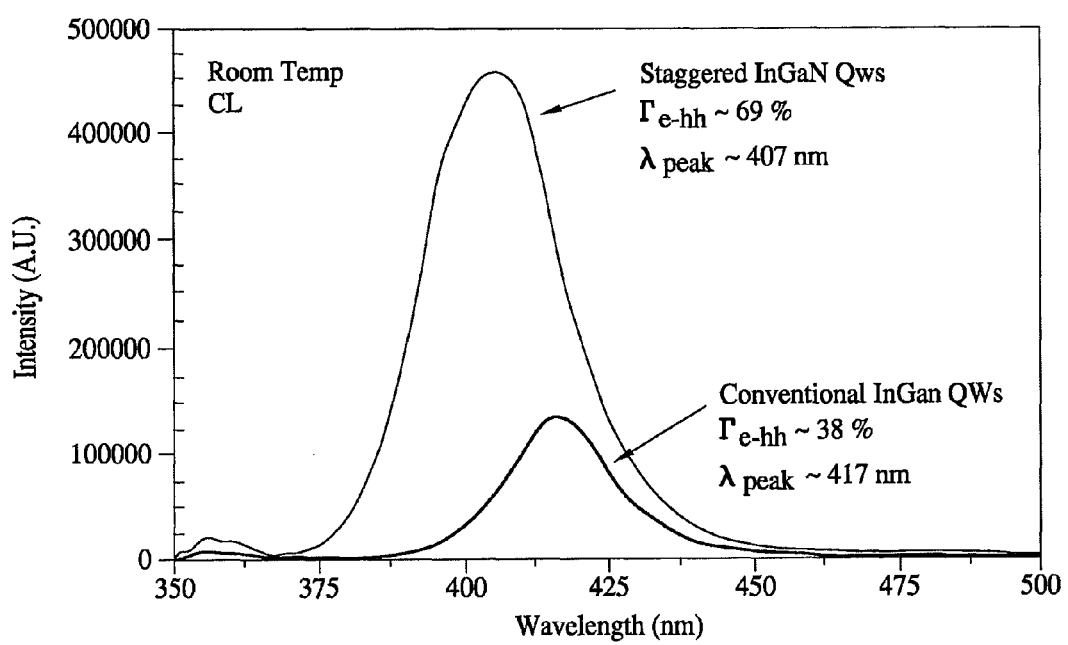
FIGS. 3 and 4 represent room temperature—cathodoluminescence spectra for staggered InGaN QW emitting in the 420-nm and 500-nm regimes.

Room temperature cathodoluminescence (RT-CL) measurements were performed utilizing a 10 keV electron beam with 11 μA of current. CL emission wavelengths for staggered QW and conventional QW were measured as 407-nm and 417-nm, respectively. CL emission of both the staggered and conventional QWs was blue-shifted by ~10-15 nm in comparison to those of the photoluminescence wavelength. The staggered QW exhibited a much higher CL peak and integrated total intensity of ~3.4 and 4.2 times that of the conventional QW, as shown in FIG. 3.

Room temperature photoluminescence (RT-PL) measurements were also performed on both samples using a 325-nm He—Cd laser. PL emission wavelengths of the staggered QW and conventional QW were measured as ~420-nm and ~430-nm, respectively. Comparison of RT-PL intensity indicated improvement in the peak and integrated luminescence intensity for the staggered In$_{0.25}$Ga$_{0.75}$N/In$_{0.15}$Ga$_{0.85}$N QWs by factors of ~4.2 times and 4.4 times, respectively, in comparison to those of the conventional In$_{0.25}$Ga$_{0.75}$N QW. Integrated luminescence improvement in the staggered InGaN QW was not accompanied by increased linewidth, rather it was attributed to higher peak intensity at the same excitation laser power. This observation was consistent with the fact that the measurements were conducted at the same temperature employing identical optical excitation power to facilitate direct spectrum comparison. The comparable linewidths further indicated similar materials quality of both the staggered and conventional InGaN QW. PL full width at half max (FWHM) for staggered InGaN QWs was observed to be ~14.8-nm (106.25 meV), which is narrower than the conventional InGaN QW of 17.26-nm (113.85 meV).

Figure 4:
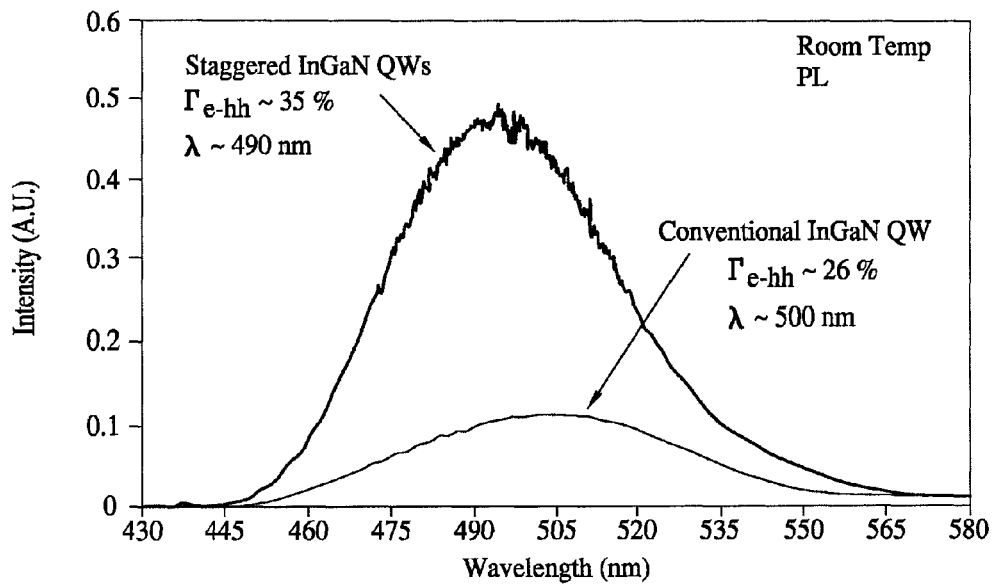

To demonstrate luminescence enhancement at longer wavelength, experiments were conducted comparing a 27-Å conventional $In_{0.26}Ga_{0.74}N$ QW and staggered 13-Å $In_{0.28}Ga_{0.72}N$/13-Å $In_{0.21}Ga_{0.79}N$ QW, emitting in the bluish-green regime $\lambda \sim 500$-525-nm. As shown in FIG. 4, the staggered $In_{0.28}Ga_{0.72}N/In_{0.21}Ga_{0.79}N$ QW improved both peak and total integrated intensity by ~4.27 and 3.54 times, respectively. This peak intensity improvement was higher than what was predicted from increase in overlap $\Gamma_{e\_hh}$ alone.

Figure 5:
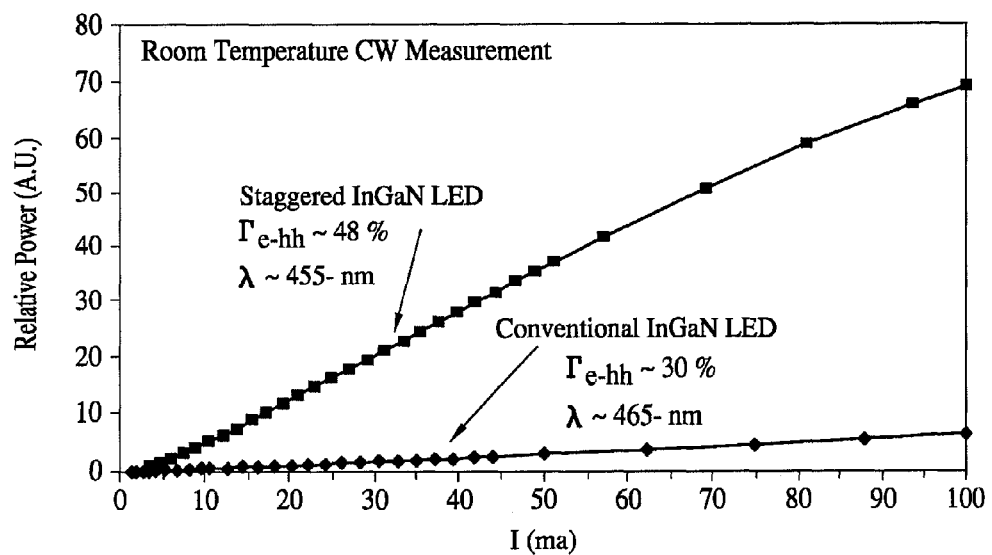
FIG. 5 is a relative power-current graph.

To assess the staggered QW in device applications, two LED structures were realized utilizing 1) 4 periods of staggered QWs of 12-Å $In_{0.25}Ga_{0.75}N$/12-Å $In_{0.15}Ga_{0.85}N$ layers, and 2) 4-periods of 27-Å conventional $In_{0.21}Ga_{0.79}N$ QWs as an active region of each LED. Both structures were grown on a 2.5-μm n-GaN template ($n \sim 3 \times 10^{18}$ cm$^{-3}$) on c-plane sapphire substrates. The acceptor level for the p-GaN layer was $\sim 3 \times 10^{17}$ cm$^{-3}$. Continuous wave (CW) power measurements were performed at room temperature. FIG. 5 shows that output power was linear as a function of driving current for up to a 100 mA current level for both LEDs. Staggered QW LEDs exhibited a significant improvement in output power by almost an order of magnitude. The observed significant enhancement was larger than that predicted theoretically.

Figure 6:
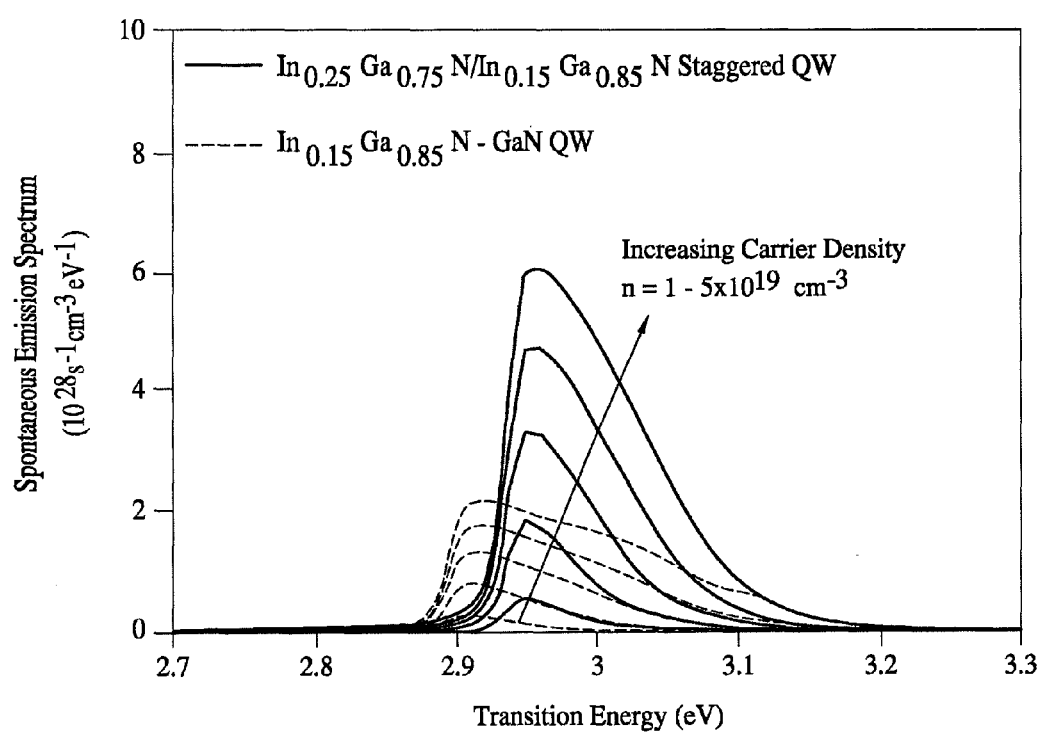
FIG. 6 and FIG. 8 are graphs of spontaneous emission spectrum and transition energy.

Calculated spontaneous emission rate spectra for corresponding conventional and staggered InGaN QW structures are shown in FIG. 6. The spectrum was plotted for carrier densities n from 1 to $5 \times 10^{19}$ cm$^{-3}$. Symbol n refers to the densities of the injected carrier that recombines radiatively in the QW active region. At $n \geq 2 \times 10^{19}$ cm$^{-3}$, peak spontaneous emission rate of the staggered InGaN QW structure was found to be approximately 3 times higher than that of the conventional one, corresponding to higher radiative recombination rate expected from the improvement of electron-hole wavefunction overlap.

In the conventional InGaN QW structure, excited state transitions become prominent as carrier density n was increased, as evident in the multiple FIG. 3 shoulder peaks at $n = 5 \times 10^{19}$ cm$^{-3}$. This phenomenon led to a broader full width half max (FWHM) of the conventional spectra than that of the staggered case at high carrier density. In the staggered InGaN QW case, the higher energy peaks are suppressed as a result of a thinner QW. This leads to minimally confined excited states and negligible higher-energy transition matrix elements, i.e., other than $E_{c1}$-$E_{HH1}$, up to $n = 5 \times 10^{19}$ cm$^{-3}$. Peak emission wavelength blueshifts as carrier density was increased. The wavelength blueshift in the staggered InGaN QW appeared to be larger than that in the conventional structure, which can be attributed to thinner staggered InGaN QW leading to faster state-filling than in the conventional case.

Carrier density dependence on recombination rate per unit volume for the QWs was calculated as follows. First, $r_{sp}(\eta\omega)$ was integrated over all frequencies to result in a spontaneous recombination rate per unit volume ($L_{sp}$) at a particular carrier density $n_o$:

$$L_{sp}(n_o) = \int r_{sp}(\eta\omega)d\omega \text{ at } n = n_o.$$

Spontaneous emission rate per unit volume ($L_{sp}$) is related to the carrier density in the QW (n) with the following phenomenological approximation: $L_{sp}(n) \cong B \cdot n \cdot p = B \cdot n^\beta$, where B is the bimolecular recombination constant for radiative transition. At sufficiently high carrier injection, electron density is typically assumed as equal to that of hole ($n \cong p$), or $\beta = 2$ is a theoretical, upper-limit value for pure radiative transition.

Figure 7:
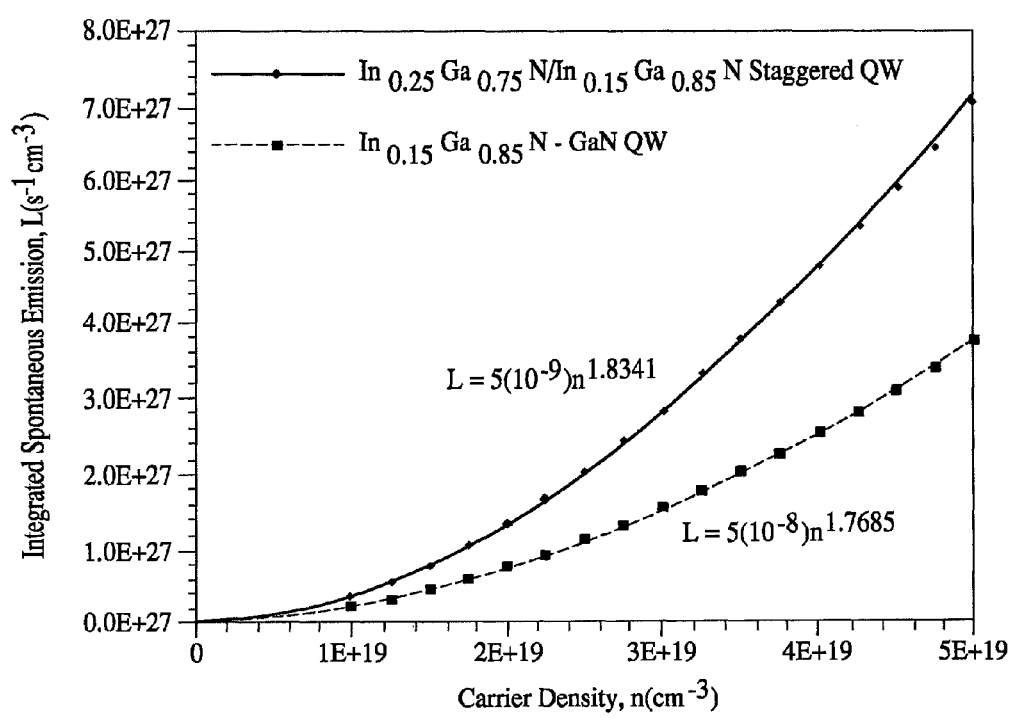
FIG. 7 is a graph of integrated spontaneous emission and carrier density.

FIG. 7 illustrates integrated spontaneous recombination rate per unit volume $L_{sp}$ of the conventional and staggered InGaN QWs plotted against carrier density, n. It was determined from FIG. 7 that $\beta < 2$ for both QWs up to $n = 5 \times 10^{19}$ cm$^{-3}$. At $n = 5 \times 10^{19}$ cm$^{-3}$, the staggered InGaN QW structure exhibited close to a two times higher integrated spontaneous emission rate of $L_{sp} = 7.05 \times 10^{27}$ s$^{-1}$ cm$^{-3}$ than the conventional $L_{sp} = 3.07 \times 10^{27}$ s$^{-1}$ cm$^{-3}$. The exponent term in the staggered QW was also larger than that of the conventional QW, i.e., $\beta_{st} = 1.8341$ and $\beta_{con} = 1.7685$, respectively. These observations confirm to a higher transition matrix element and higher radiative recombination rate for the staggered InGaN QW structure.

A typical non-polar GaAs or InGaAs QW active region with no built-in polarization fields, has a spontaneous recombination rate per unit volume ($L_{sp}$) wherein dependence on carrier density (n) is described as $L_{sp} \sim n^2$. The spontaneous recombination current density ($J_{sp}$) can be expressed as: $J_{sp} = q \cdot d_{QW} \cdot L_{sp}$, where $d_{QW}$ is the QW thickness. Departure of $\beta$ of less than 2 in non-polar QWs indicates the presence of monomolecular non-radiative recombination.

FIG. 7 indicates the phenomenological carrier density exponent ($\beta$) as less than 2 for both conventional and staggered InGaN QW active regions. In a nitride-based active region emitting in the visible regime, the contribution of Auger recombination is very small. Thus the Auger term can be neglected. Thus, it is important that the recombination analysis for nitride-based InGaN QW systems take into account a correct phenomenological carrier density exponent ($\beta$). Recombination analysis without taking into account correct $\beta$ leads to underestimation of the InGaN QW active region radiative efficiency.

Figure 8:
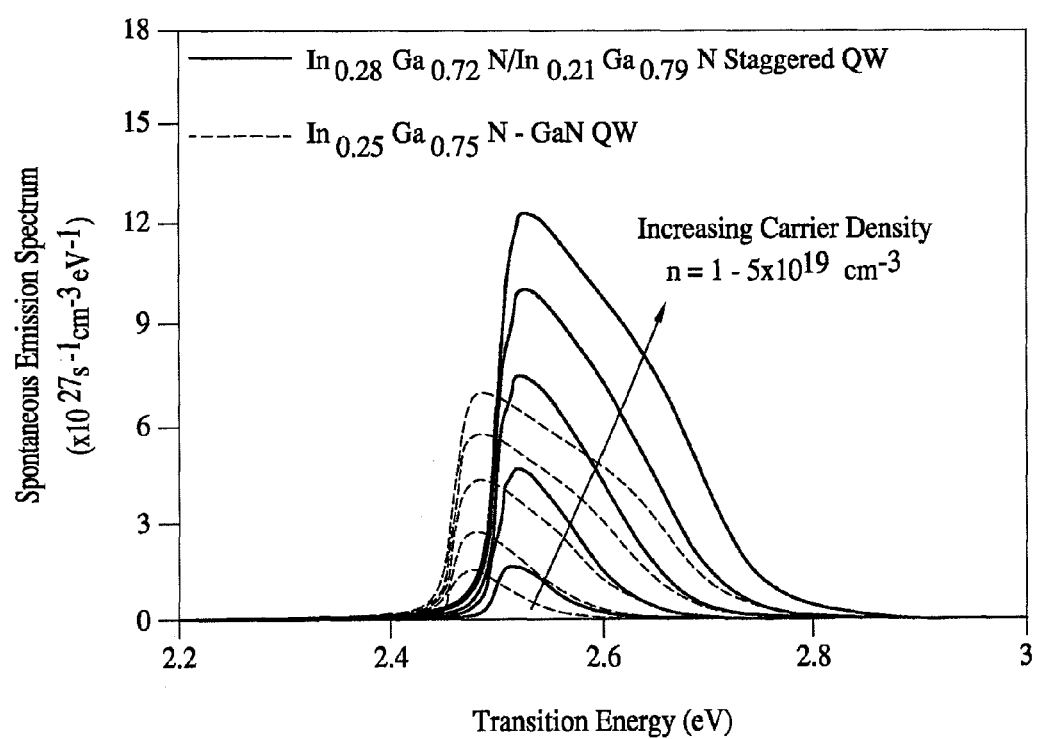

Conventional and staggered InGaN QW structures emitting at $\lambda_{peak} = 500$-510-nm were investigated. The calculated spontaneous emission rate spectrum at this wavelength regime is shown in FIG. 8 for carrier density n from $1 - 5 \times 10^{19}$ cm$^{-3}$. The structures used in this EXAMPLE were 27-Å conventional $In_{0.25}Ga_{0.75}N$ QW and staggered 13-Å $In_{0.28}Ga_{0.72}N$/13-Å $In_{0.21}Ga_{0.79}N$ QW. Similar to the 420-nm regime case (FIG. 6), wavelength blueshift was observed with increasing carrier density due to state-filling. Higher energy transitions gave rise to shoulder peaks that were visible in both the conventional and staggered spectra. At k=0, wavefunction overlap for $E_{C1}$-$E_{HH1}$ transition ($\Gamma_{e\_hh}$) for the conventional and staggered InGaN QW case were 24.4% and 32.2%, respectively. Improvement in peak spontaneous emission spectrum of the staggered InGaN QW was found to be approximately 1.7 times higher than that of the conventional for carrier density $n \geq 3 \times 10^{19}$ cm$^{-3}$.

Nominal calculated values of spontaneous emission spectrum at this $\lambda_{peak} = 500$-515-nm regime were close to one order of magnitude lower than that of the 420-nm regime. This may be attributed to the high In-content required to achieve long emission wavelength. The high In-content leads to high polarization field and lower wavefunction overlap ($\Gamma_{e\_hh}$) Spontaneous recombination rate is thus—inevitably—reduced significantly. A thick QW to minimize quantum confinement further exacerbates this low recombination rate at the long wavelength regime of green and beyond.

For the case of 420-430 nm emitting InGaN QW, the optimized staggered InGaN QW design consisted of 7.5-Å $In_{0.25}Ga_{0.75}N$/7.5-Å $In_{0.15}Ga_{0.85}N$ (with total QW thickness of 15-Å). Utilizing 15 Å QW thickness for the conventional QW structure would have improved radiative efficiency, however the use of 15-Å $In_{0.15}Ga_{0.85}N$ (similar content with conventional QW) results in a much shorter wavelength $\lambda \sim 400$-nm (not $\lambda \sim 420\text{-}430$ nm) which would not provide comparison in the same wavelength regime.

For the case of 500-505-nm emitting InGaN QW, both conventional and staggered QW structures utilized substantially nominally identical QW thicknesses, which were 26 Å for the staggered and 27 Å for the conventional QWs (26% In-content). The staggered InGaN QW consisted of 13-Å $In_{0.28}Ga_{0.72}N$/13-Å $In_{0.21}Ga_{0.79}N$ layers with a much higher wavefunction overlap $\Gamma_{e\_hh}$. The higher radiative efficiency (from improved PL/CL intensity) for the staggered InGaN QW was in agreement with 1) the calculation of the spontaneous recombination rate spectra photoluminescence (PL) and cathodoluminescence (CL) measurement results. Thus, the improvement in the CL/PL intensity observed in the 500-nm regime staggered InGaN QW is not attributed to the thinner QW, rather to the end use of staggered QW structure with improved $\Gamma_{e\_hh}$ (as evidenced from the comparison for QWs emitting in the 500-nm spectral range).

In summary, polarization band engineering via staggered InGaN QW layers leads to significant enhancement of radiative recombination rate. Improvement in peak luminescence intensity and integrated luminescence by a factor ~3.5-4 times was experimentally demonstrated for staggered InGaN QW active regions emitting in 420-430 nm and 490-500 nm, in comparison to those of conventional InGaN QW designs. Preliminary LED devices fabricated with staggered InGaN QW emitting in $\lambda \sim 455\text{-}465$ nm, showed an almost order magnitude improvement in device output power.

The staggered QW layers provide significantly improved radiative recombination rate and optical gain in comparison to non staggered InGaN QW. Experimental results of light emitting diode structures utilizing staggered InGaN QW showed good agreement with theory. The staggered InGaN QW allowed polarization engineering to improve photoluminescence intensity and LED output power as a result of enhanced radiative recombination rate.

While preferred embodiments of the invention have been described, the present invention is capable of variation and modification and therefore should not be limited to the precise details of the EXAMPLES. The invention includes changes and alterations that fall within the purview of the following claims.

What is claimed is:

1. A light emitting device comprising:
a type I quantum well comprising:
a pair of large band gap barrier layers; and
a quantum well active region sandwiched between said pair of large band gap barrier layers, said quantum well active region comprising a plurality of active layers of InGaN in abutting relationship adjacent one another between said pair of large bandgap barrier layers, each of said plurality of active layers having an Indium content distinctly different from a respective Indium content of each abutting active layer, said plurality of active layers collectively providing a non-uniform material composition across said plurality of active layers within said quantum well active region.

2. The light emitting device of claim 1, wherein the quantum well comprises a composition $X_n$ wherein X is a quantum well component, and wherein, in one quantum well active layer n is a step function greater than in a layer comprising a composition for emission at a target wavelength regime, and in another quantum well active layer n is a step function less than in the layer comprising the composition for emission at the target wavelength regime.

3. The light emitting device of claim 1, wherein the quantum well comprises staggered GaN/InGaN layers.

4. The light emitting device of claim 1, wherein the quantum well comprises multiple InGaN layers have complementary step function In-content profiles.

5. The light emitting device of claim 1, wherein the quantum well comprises multiple InGaN layers of varying In and Ga contents.

6. The light emitting device of claim 1, wherein the quantum well comprises multiple InGaN layers selected from the staggered layer combinations consisting of 7.5-Å $In_{0.25}Ga_{0.75}N$/7.5-Å $In_{0.15}Ga_{0.85}N$; 12-Å $In_{0.25}Ga_{0.75}N$/12-Å $In_{0.15}Ga_{0.85}N$; 13-Å $In_{0.28}Ga_{0.72}N$/13-Å $In_{0.21}Ga_{0.29}N$; and 4-periods of 7.5-Å $In_{0.25}Ga_{0.75}N$/7.5-Å $In_{0.15}Ga_{0.85}N$.

7. The light emitting device of claim 1, wherein the quantum well comprises multiple InGaN layers comprising 4-periods of 7.5-Å $In_{0.25}Ga_{0.75}N$/7.5-Å $In_{0.15}Ga_{0.85}N$.

8. The light emitting device of claim 1, comprising a substrate; a first contact layer comprising a GaN-based material having a first conduction type located on top of the substrate; an active layer comprising the staggered composition quantum well located on top of the first contact layer; a second contact layer comprising a GaN-based material having a second conduction type opposite to the first conduction type located on top of the active layer.

9. The light emitting device of claim 1, comprising a staggered 13-Å $In_{0.28}Ga_{0.72}N$/13-Å $In_{0.21}Ga_{0.79}N$ QW emitting at $\|_{peak}$=500-510-nm.

10. A method for improving radiative light efficiency of a light emitting device, comprising:
providing a semiconductor substrate; and
forming on the substrate, a succession of layers to provide a staggered composition quantum well surrounded by barrier layers, the staggered composition quantum well comprising:
a plurality of active layers of InGaN in abutting relationship adjacent one another between said barrier layers, each of said barrier layer abutting a respective one of said plurality of active layers of InGaN, each of said plurality of active layers having a band gap characteristic distinctly different from a respective band gap characteristic of each abutting active layer, said plurality of active layers collectively having a plurality of distinctly different band gap characteristics that collectively provide a non-uniform material composition having an abrupt step function-like transition in band gap characteristics across said plurality of active layers within said quantum well active region.

11. The product of the process of claim 10.

12. An optoelectronic device comprising: a multilayer semiconductor structure comprising GaN layers sandwiching and abutting an active region, the active region comprising a staggered composition quantum well, the staggered composition quantum well comprising a plurality of active layers of InGaN in abutting relationship adjacent one another, each of said plurality of active layers having a band gap characteristic distinctly different from a respective band gap characteristic of each abutting active layer, said plurality of active layers collectively having a plurality of distinctly different band gap characteristics that collectively provide a non-uniform material composition having an abrupt step function-like transition in band gap characteristics across said plurality of active layers within said active region.

13. The optoelectronic device of claim 12, wherein the quantum well comprises a composition $X_n$ wherein X is a quantum well component and in one quantum well layer n is a greater step function and in another quantum well layer n is a lesser step function than in a layer comprising a composition for emission at a target light regime.

14. The optoelectronic device of claim 12, wherein the quantum well comprises staggered GaN/InGaN layers.

15. The optoelectronic device of claim 12, wherein the quantum well comprises multiple InGaN layers have complementary step function In-content profiles.

16. The optoelectronic device of claim 12, wherein the quantum well comprises multiple InGaN layers of varying In and Ga content.

17. The optoelectronic device of claim 12, wherein the quantum well comprises multiple InGaN layers selected from the staggered layer combinations consisting of 7.5-Å $In_{0.25}Ga_{0.75}N$/7.5-Å $In_{0.15}Ga_{0.85}N$; 12-Å $In_{0.25}Ga_{0.75}N$/12-Å $In_{0.15}Ga_{0.85}N$; 13-Å $In_{0.28}Ga_{0.72}N$/13-Å $In_{0.21}Ga_{0.29}N$; and 4-periods of 7.5-Å $In_{0.25}Ga_{0.75}N$/7.5-Å $In_{0.15}Ga_{0.85}N$.

18. The optoelectronic device of claim 12, wherein the quantum well comprises multiple InGaN layers comprising 4-periods of 7.5-Å $In_{0.25}Ga_{0.75}N$/7.5-Å $In_{0.15}Ga_{0.85}N$.

19. The optoelectronic device of claim 12, comprising a substrate; a first contact layer comprising a GaN-based material having a first conduction type located on top of the substrate; an active layer comprising the staggered composition quantum well located on top of the first contact layer; a second contact layer comprising a GaN-based material having a second conduction type opposite to the first conduction type located on top of the active layer.

20. A light emitting device comprising:
a type I quantum well comprising:
  a pair of barrier layers, each of said pair of barrier layers having a large band gap characteristic causing said pair of barrier layers to function as barrier layers within the quantum well; and
  a quantum well active region sandwiched between said pair of barrier layers, said quantum well active region comprising:
    a plurality of active layers of InGaN in abutting relationship adjacent one another between said pair of large barrier layers, each of said plurality of active layers having a band gap characteristic distinctly different from a respective band gap characteristic of each abutting active layer, said plurality of active layers collectively having a plurality of distinctly different band gap characteristics that collectively provide a non-uniform material composition having an abrupt step function-like transition in band gap characteristics across said plurality of active layers within said quantum well active region.

* * * * *